(12) United States Patent
Ying et al.

(10) Patent No.: US 9,196,587 B2
(45) Date of Patent: Nov. 24, 2015

(54) SEMICONDUCTOR DEVICE HAVING A DIE AND THROUGH SUBSTRATE-VIA

(71) Applicant: Maxim Integrated Products, Inc., San Jose, CA (US)

(72) Inventors: Xuejun Ying, San Jose, CA (US); Arkadii V. Samoilov, Saratoga, CA (US); Peter McNally, Saratoga, CA (US); Tyler Parent, Pleasanton, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 125 days.

(21) Appl. No.: 13/930,417

(22) Filed: Jun. 28, 2013

(65) Prior Publication Data

US 2014/0264844 A1    Sep. 18, 2014

Related U.S. Application Data

(60) Provisional application No. 61/783,486, filed on Mar. 14, 2013.

(51) Int. Cl.
| | |
|---|---|
| *H01L 23/52* | (2006.01) |
| *H01L 29/40* | (2006.01) |
| *H01L 23/28* | (2006.01) |
| *H01L 23/538* | (2006.01) |
| *H01L 23/498* | (2006.01) |
| *H01L 23/00* | (2006.01) |
| *H01L 23/13* | (2006.01) |
| *H01L 23/14* | (2006.01) |
| *H01L 21/48* | (2006.01) |
| *H01L 21/56* | (2006.01) |
| *H01L 23/544* | (2006.01) |
| *H01L 23/31* | (2006.01) |
| *H01L 25/065* | (2006.01) |

(52) U.S. Cl.
CPC .......... *H01L 23/5384* (2013.01); *H01L 21/486* (2013.01); *H01L 21/568* (2013.01); *H01L 23/13* (2013.01); *H01L 23/147* (2013.01); *H01L 23/49811* (2013.01); *H01L 23/5389* (2013.01); *H01L 23/544* (2013.01); *H01L 24/18* (2013.01); *H01L 23/3128* (2013.01); *H01L 25/0657* (2013.01); *H01L 2223/5448* (2013.01); *H01L 2223/54426* (2013.01); *H01L 2223/54453* (2013.01); *H01L 2224/92144* (2013.01); *H01L 2924/1305* (2013.01); *H01L 2924/13055* (2013.01); *H01L 2924/13091* (2013.01)

(58) Field of Classification Search
None
See application file for complete search history.

(56) References Cited

U.S. PATENT DOCUMENTS

| | | | |
|---|---|---|---|
| 2012/0037935 A1* | 2/2012 | Yang | 257/98 |
| 2013/0093091 A1* | 4/2013 | Ma et al. | 257/751 |
| 2014/0015136 A1* | 1/2014 | Gan et al. | 257/751 |

*Primary Examiner* — Sonya D McCall Shepard
(74) *Attorney, Agent, or Firm* — Advent, LLP

(57) ABSTRACT

Semiconductor devices are described that have a through-substrate via formed therein. In one or more implementations, the semiconductor devices include a semiconductor wafer and an integrated circuit die bonded together with an adhesive material. The semiconductor wafer and the integrated circuit die include one or more integrated circuits formed therein. The integrated circuits are connected to one or more conductive layers deployed over the surfaces of the semiconductor wafer and an integrated circuit die. A via is formed through the semiconductor wafer and the patterned adhesive material so that an electrical interconnection can be formed between the integrated circuits formed in the semiconductor wafer and the integrated circuits formed in the integrated circuit die. The via includes a conductive material that furnishes the electrical interconnection between the semiconductor wafer and the integrated circuit die.

12 Claims, 7 Drawing Sheets

FIG. 1B

SEMICONDUCTOR DEVICE HAVING A DIE AND THROUGH SUBSTRATE-VIA

CROSS-REFERENCE TO RELATED APPLICATIONS

The present application claims the benefit under 35 U.S.C. §119(e) of U.S. Provisional Application Ser. No. 61/783,486, filed Mar. 14, 2013, and titled "SEMICONDUCTOR DEVICE HAVING A DIE AND THROUGH-SUBSTRATE VIA." U.S. Provisional Application Ser. No. 61/783,486 is herein incorporated by reference in its entirety.

BACKGROUND

Consumer electronic devices, in particular, mobile electronic devices such as smart phones, tablet computers, and so forth, increasingly employ smaller, more compact components to furnish their users with desired features. Such devices often employ three dimensional integrated circuit devices (3D IC). Three-dimensional integrated circuit devices are semiconductor devices that employ two or more layers of active electronic components. Through-substrate vias (TSV) interconnect electronic components on the different layers (e.g., different substrates) of the device allowing the devices to be integrated vertically as well as horizontally. Consequently, three-dimensional integrated circuit devices can provide increased functionality within a smaller, more compact footprint than do conventional two-dimensional integrated circuit devices.

SUMMARY

Semiconductor devices are described that include a semiconductor wafer and an integrated circuit die bonded together. Through-substrate vias (TSV) furnish electrical interconnectivity to electronic components formed in the semiconductor wafer and the integrated circuit die. In implementations, the semiconductor devices are fabricated by bonding a semiconductor wafer and an integrated circuit die together using an adhesive material, such as a dielectric. The adhesive material allows for lateral expansion when the integrated circuit die is attached to the semiconductor wafer and during the bonding process. For example, an integrated circuit die may be bonded to a semiconductor wafer by applying adhesive material to a second (e.g., backside or bottom) surface of the semiconductor wafer. The adhesive material may then be used to bond the integrated circuit die to the second (e.g., backside or bottom) surface of the semiconductor wafer. Vias may then be formed through the semiconductor wafer and the patterned adhesive material to furnish electrical interconnection between the semiconductor wafer and the integrated circuit die. The semiconductor wafer may then be segmented into individual semiconductor devices.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DRAWINGS

The detailed description is described with reference to the accompanying figures. The use of the same reference numbers in different instances in the description and the figures may indicate similar or identical items.

FIG. 1B is a diagrammatic partial cross-sectional view illustrating a semiconductor device at wafer level (e.g., prior to singulation of the device) in accordance with an example implementation of the present disclosure.

DETAILED DESCRIPTION

Overview

Figure 1A:
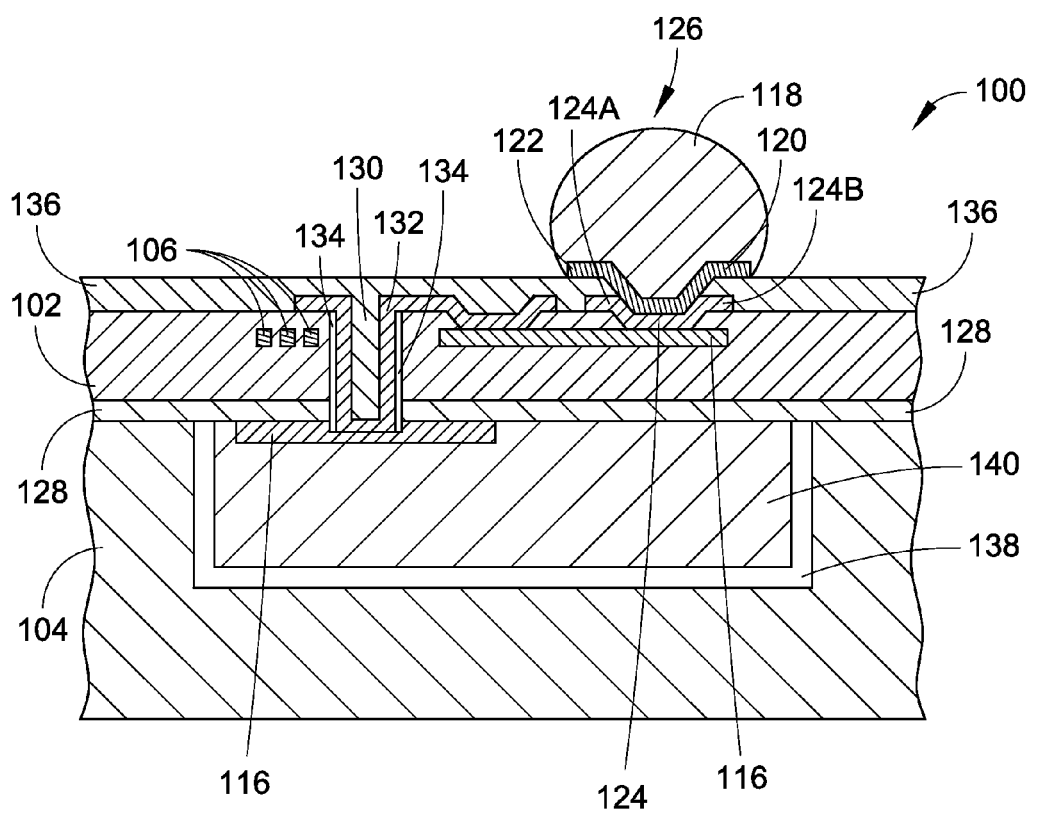
FIG. 1A is a diagrammatic partial cross-sectional view illustrating a semiconductor device at wafer level (e.g., prior to singulation of the device) in accordance with an example implementation of the present disclosure.

Three-dimensional integrated circuit devices are commonly manufactured using die-on-wafer techniques wherein electronic components (e.g., circuits) are first fabricated on two or more semiconductor wafers. The individual die are aligned on and attached to semiconductor wafers and segmented to provide individual devices. Through-substrate vias (TSV) are either built into wafers before they are attached, or else created in the wafer stack after attachment. However, the fabrication of three-dimensional integrated circuit devices requires additional manufacturing steps to join the die and wafers together. This increases the cost of the devices. Moreover, each extra manufacturing step adds a risk for inducing defects, possibly reducing device yield.

Accordingly, techniques are described to fabricate semiconductor devices having multiple, stacked die on a substrate (e.g., a semiconductor wafer) in a reliable, production-worthy way. In one or more implementations, wafer-level package devices that employ example techniques in accordance with the present disclosure include a die bonded to the backside of a semiconductor wafer with an adhesive material. The die and semiconductor wafer include one or more integrated circuits formed therein. Through-substrate vias (TSV) are formed through the semiconductor wafer and the adhesive material is disposed between the die and the semiconductor wafer. The through-substrate vias in the semiconductor wafer include a conductive material, such as copper, that furnishes electrical interconnection between the integrated circuits in the semiconductor wafer and the die. It is contemplated that more than one die may be provided for attaching to the semiconductor wafer.

In implementations, a wafer-level package device that employs example techniques in accordance with the present disclosure includes bonding a carrier wafer to a processed semiconductor wafer, using an adhesive material to attach an integrated circuit die to a second side of the processed semiconductor wafer, removing the carrier wafer, and forming a through-silicon via in the processed semiconductor wafer, where the through-silicon via furnishes an electrical connection between the processed semiconductor wafer and the integrated circuit die. Additionally, the integrated circuit die may be placed in a cavity on the second side (e.g., the backside) of the semiconductor wafer or may be covered by a cap wafer placed over the integrated circuit die and on the second side of the processed semiconductor wafer. The processed semiconductor wafer may then be segmented into individual semiconductor devices.

Example Implementations

FIG. 1 illustrates a semiconductor semiconductor device 100 in accordance with example implementations of the present disclosure. As shown, the semiconductor semiconductor device 100 is illustrated at wafer level prior to singulation of the semiconductor semiconductor device 100. The semiconductor semiconductor device 100 includes a semiconductor wafer 102. The semiconductor wafer 102 includes one or more integrated circuits (not shown), which are formed within the semiconductor wafer 102. As illustrated in FIG. 1, the semiconductor wafer 102 further includes one or more alignment marks 106. The alignment marks 106 may be utilized to align the semiconductor wafer 102 with a carrier wafer (described herein below). Additionally, the alignment marks 106 may be utilized to indicate a location for forming a through-silicon via 130, further described below. The semiconductor wafer 102 includes a first (e.g., top or front) surface and a second (e.g., bottom or backside) surface. The integrated circuits are formed (e.g., fabricated) proximate to the first surface of the semiconductor wafer 102. It is contemplated that the first and/or the second surface of the semiconductor wafer 102 may be planarized or unplanarized.

The semiconductor wafer 102 include a base material utilized to form one or more integrated circuit devices through various fabrication techniques such as photolithography, ion implantation, deposition, etching, and so forth. The semiconductor wafer 102 may be configured in a variety of ways. For example, the semiconductor wafer 102 may comprise an n-type silicon wafer or a p-type silicon wafer. In an implementation, the semiconductor wafer 102 may comprise group V elements (e.g., phosphorus, arsenic, antimony, etc.) configured to furnish n-type charge carrier elements. In another implementation, the semiconductor wafer 102 may comprise group IIIA elements (e.g., boron, etc.) configured to furnish p-type charge carrier elements. Further, the integrated circuits may be configured in a variety of ways. For example, the integrated circuits may include digital integrated circuits, analog integrated circuits, mixed-signal circuits, and so forth. In one or more implementations, the integrated circuits may include digital logic devices, analog devices (e.g., amplifiers, etc.), combinations thereof, and so forth. As described above, the integrated circuits may be fabricated utilizing various fabrication techniques. For example, the integrated circuits may be fabricated via complimentary metal-oxide-semiconductor (CMOS) techniques, bi-polar semiconductor techniques, and so on.

As shown in FIG. 1, the semiconductor semiconductor device 100 also includes one or more area arrays of conductive layers 116 of the semiconductor wafer 102. In an implementation, the conductive layers 116 may comprise one or more conductive (e.g., contact) pads, redistribution structures, or the like. In a further implementation, the conductive layers 116 may include seed metal and/or barrier metal layers to allow for plated-line formation. The number and configuration of conductive layers 116 may vary depending on the complexity and configuration of the integrated circuits, and so forth. The conductive layers 116 provide electrical contacts through which the integrated circuits are interconnected to other components, such as printed circuit boards (not shown), when the semiconductor devices 100 are configured as wafer-level packaging (WLP) devices or other integrated circuits disposed within the semiconductor semiconductor device 100. In one or more implementations, the conductive layers 116 may comprise an electrically conductive material, such as a metal material (e.g., aluminum, copper, etc.), or the like.

The conductive layers 116 may furnish electrical interconnection between various electrical components associated with the semiconductor semiconductor device 100. For instance, a first conductive layer 116 deployed over the semiconductor wafer 102 may furnish an electrical interconnection to a second conductive layer 116 deployed over another device (e.g., an integrated circuit die 140). In another instance, a conductive layer 116 deployed over the semiconductor wafer 102 may provide electrical interconnection with one or more solder bumps 118. Solder bumps 118 are provided to furnish mechanical and/or electrical interconnection between the conductive layers 116 and corresponding pads (not shown) formed on the surface of a printed circuit board (not shown) or another semiconductor device. In one or more implementations, the solder bumps 118 may be fabricated of a lead-free solder such as a Tin-Silver-Copper (Sn—Ag—Cu) alloy solder (i.e., SAC), a Tin-Silver (Sn—Ag) alloy solder, a Tin-Copper (Sn—Cu) alloy solder, and so on. However, it is contemplated that Tin-Lead (PbSn) solders may be used.

Bump interfaces 120 may be applied to the conductive layers 116 to provide a reliable interconnect boundary between the conductive layers 116 and the solder bumps 118. For instance, in the semiconductor semiconductor device 100 shown in FIG. 1, the bump interface 120 comprises under-bump metallization (UBM) 122 applied to the conductive layers 116 of the integrated circuit chip 102. The UBM 122 may have a variety of compositions. For example, the UBM 122 include multiple layers of different metals (e.g., Aluminum (Al), Nickel (Ni), Copper (Cu), etc.) that function as an adhesion layer, a diffusion barrier layer, a solderable layer, an oxidation barrier layer, and so forth. However, other UBM structures are possible.

In one or more implementations, the semiconductor semiconductor device 100 may employ a Redistribution Layer ("RDL") configuration. The RDL configuration employs a redistribution structure 124 comprised of a thin-film metal (e.g., aluminum, copper, etc.) rerouting and interconnection system that redistributes the conductive layers 116 to an area array of bump interfaces 120 (e.g., UBM pads) that may be more evenly deployed over the surface of the semiconductor semiconductor device 100. The solder bumps 118 are subsequently placed over these bump interfaces 120 to form bump assemblies 126.

As illustrated in FIG. 1, the redistribution layer 124 may include wings 124A, 124B to provide further structural support to the solder bumps 118. The structural support may reduce the stress to the semiconductor semiconductor device 100, which may prevent the cracking of the semiconductor semiconductor device 100 during various testing phases (e.g., temperature cycling, drop testing, etc.). In one or more implementations, the wings 124A, 124B provide a redistribution layer 124 extension that may extend to approximately the width (W) of the solder bump 118. However, it is contemplated that the wings 124A, 124B may extend beyond (e.g., greater than) the width (W) of the solder bumps 118 in some implementations and may not extend (e.g., less than) the width (W) of the solder bumps 118 in other implementations. It is contemplated that the extension of the wings 124A, 124B may vary depending on the various characteristics of the semiconductor semiconductor device 100, such as the structural requirements of the semiconductor semiconductor device 100, the power requirements of the semiconductor semiconductor device 100, and so forth.

While FIG. 1 illustrates a semiconductor semiconductor device 100 that employs a Redistribution Layer ("RDL") configuration, it is contemplated that the semiconductor semiconductor device 100 illustrated and described herein may also employ a Bump-On-Pad ("BOP") configuration. The BOP configuration may employ a conductive layer 116 disposed under the bump interface 120 (e.g., UBM pads).

Viewed together, the solder bumps 118 and associated bump interfaces 120 (e.g., UBM 122) comprise bump assemblies 126 that are configured to provide mechanical and/or electrical interconnection of the integrated circuits formed in the semiconductor wafer 102 to the printed circuit board (not shown).

The semiconductor semiconductor device 100 further includes an adhesive material 128 disposed on a second side (e.g., the backside or side opposite the formed integrated circuits) of the semiconductor wafer 102. The adhesive material 128 is configured to bond the semiconductor wafer 102 and the integrated circuit die 140 once the integrated circuit die 140 is placed on the semiconductor wafer 102. The adhesive material 128 may be configured in a variety of ways. For example, the adhesive material 128 may be an adhesive dielectric material such as benzocyclobutene (BCB), or the like. In one implementation, the adhesive material 128 is configured to be patterned (e.g., not continuous) to allow for lateral expansion when the adhesive material 128 is pressed vertically (e.g., the integrated circuit die 140 is brought into contact with the adhesive material 128) for bonding purposes. In this implementation, the patterned adhesive material 128 is coated at least partially over the second surface of the semiconductor wafer 102 and then patterned to allow the adhesive material 128 to reflow laterally during the bonding procedure. Moreover, the adhesive material 128 may function to planarize the second surface of the semiconductor wafer 102 (e.g., when the semiconductor wafer 102 is non-planarized) during reflow of the adhesive material 128.

The semiconductor device 100 includes an integrated circuit die 140 that is attached to the second side (e.g., backside) of the semiconductor wafer 102. In embodiments, the integrated circuit die 140 includes a conductive pad 116 (e.g., a bond pad) that functions as an electrical connection between the integrated circuit die 140 and the electrical interconnections of the semiconductor wafer 102. The conductive pad 116 may be exposed or may be covered by a passivation layer. In implementations, the integrated circuit die 140 is attached to the adhesive material 128 on the second side of the semiconductor wafer 102. In one implementation, the integrated circuit die 140 is attached to the backside of the semiconductor wafer 102 using benzocyclobutene (BCB) as the adhesive material 128. Additionally, the integrated circuit die 140 may be attached and properly aligned using alignment marks 106 formed in the semiconductor wafer 102.

In one embodiment and as shown in FIG. 1A, an integrated circuit die 140 is attached to the second side (e.g., backside) of the semiconductor wafer 102 and the adhesive material 128. In this embodiment, the integrated circuit die 140 includes a conductive pad 116 that functions as an electrical interconnection between the integrated circuit die 140 and the semiconductor wafer 102. Additionally, a cap wafer 104 may be attached to the semiconductor wafer 102 and the adhesive material 128, where the cap wafer 104 includes a pre-formed cavity 138 configured to house the integrated circuit die 140. The cap wafer 104 may include a wafer (e.g., an unprocessed passive silicon wafer) that is configured to provide protection to the integrated circuit die 140. The cap wafer 104 functions to structurally and environmentally protect the integrated circuit die 102. The cap wafer 104 may be thinned as necessary to reduce weight and/or bulk of the semiconductor device 100. In some implementations, the cap wafer 104 may be background so that the integrated circuit die 140 is at least partially exposed. In these implementations, the cavity 138 may be at least partially filled with a mold compound or an encapsulation material to further protect the integrated circuit die 140.

Figure 1B:
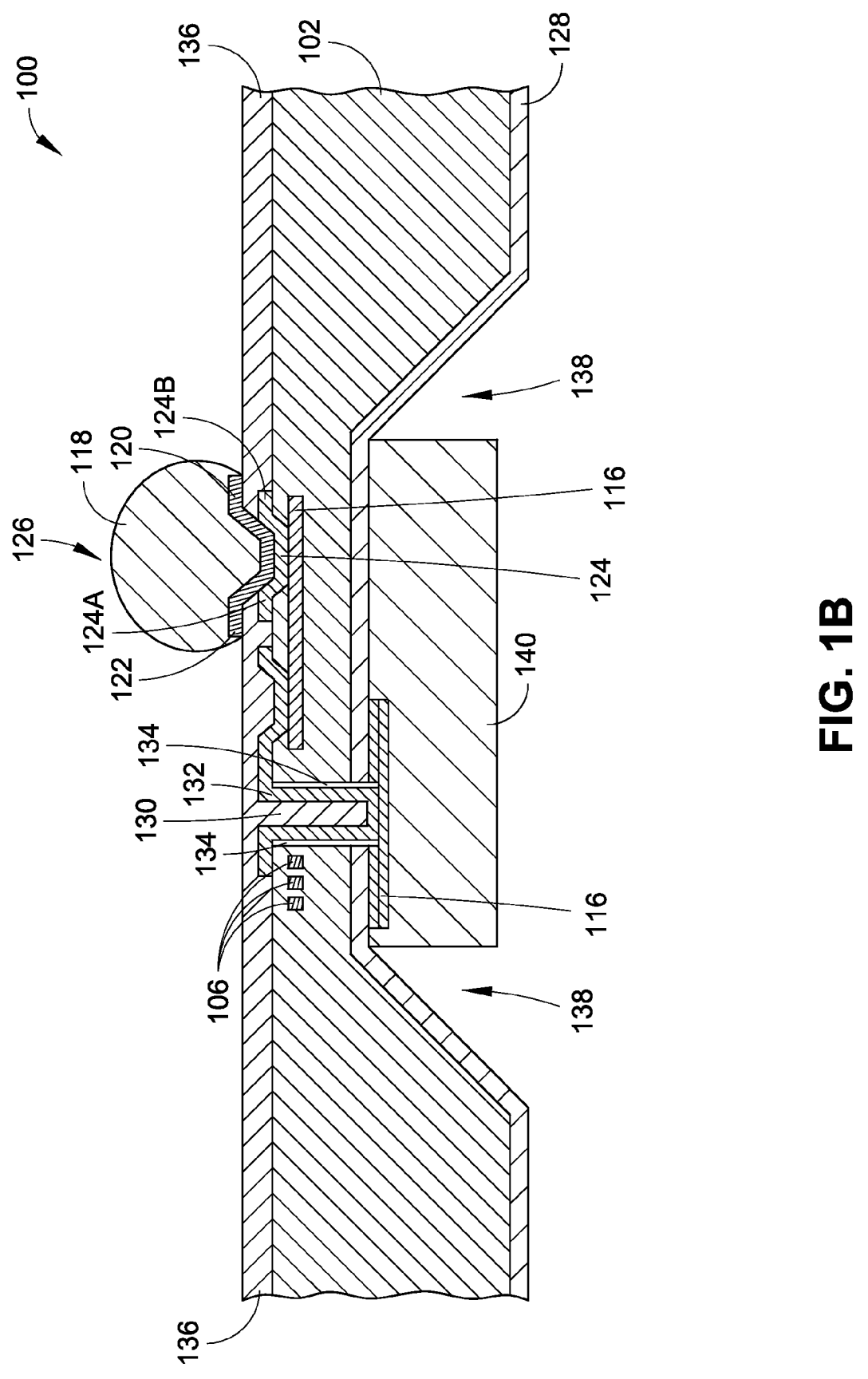

In another embodiment and as shown in FIG. 1B, a second side (e.g., backside) of the semiconductor wafer 102 is patterned and wet-etched to form a cavity 138 configured to house the integrated circuit die 140. The cavity 138 is configured to house a substantially planar integrated circuit die 140. The second surface of the semiconductor wafer 102 to which the integrated circuit die 140 is attached and the adhesive material 128 must also be substantially planar to form a solid attachment. In some implementations, the cavity 138 may subsequently be filled with a mold or encapsulation material to further protect the integrated circuit die 102.

The semiconductor device 100 also includes a via 130 (e.g., a through-substrate via (TSV)) that extends through the semiconductor wafer 102 and the adhesive material 128 to at least one conductive layer 116 of the integrated circuit die 140. As illustrated in FIGS. 1A and 1B, the via 130 includes a conductive material 132 that furnishes an electrical interconnection between a first conductive layer 116 of semiconductor wafer 102 and a second conductive layer 116 of the integrated circuit die 140. In one or more implementations, the conductive material 132 may include a metal material (e.g., copper, aluminum, etc.). For instance, the via 130 may provide an electrical interconnection between a first integrated circuit formed in the semiconductor wafer 102 and a second integrated circuit formed in the integrated circuit die 140.

The via 130 also includes an insulating liner 134 to electrically isolate the conductive material 132 disposed in the via 130 from the semiconductor wafer 102. As illustrated in FIGS. 1A and 1B, the insulating liner 134 is deposited in the via 130 such that the insulating liner 134 extends through the via 130 at least substantially the thickness of the semiconductor wafer 104 (e.g., the first surface to the second surface), as well as at least substantially the thickness of the adhesive material 128 to the conductive pad 116 of the integrated circuit die 140. The insulating liner 134 may be configured in a variety of ways. For example, the insulating liner 134 may be an insulating material (e.g., an oxide material, a nitride material, etc.). The insulating liner 134 is formed by depositing the insulating material in the via 130 and then etching the insulating material to form the insulating liner 134 along the sides of the via 130. In one or more implementations, the insulating material may be deposited via plasma-enhanced chemical vapor deposition (PECVD) techniques and then anisotropically etching the insulating material down to the contact pad 116 of the integrated circuit die 140 to form the insulating liner 134. In one or more implementations, the insulating material may include a silicon dioxide ($SiO_2$) material or the like.

While a wafer and an attached integrated circuit die (e.g., semiconductor wafer 102, integrated circuit die 140) are shown in FIGS. 1A and 1B, it is contemplated that the semiconductor device 100 may employ additional wafers and/or die stacked and bonded together. For example, a third die may be positioned over the first or second surface of the semiconductor wafer 102 and one or more vias formed therein. It is contemplated that many through-silicon via configurations may be utilized depending on the characteristics of semiconductor device 100 (e.g., design requirements, structural requirements, etc.).

In accordance with the present disclosure, a semiconductor device 100 includes a semiconductor wafer 102 with an integrated circuit die 140 bonded together via an adhesive material 128. In some embodiments, the adhesive material 128 may be selectively patterned before the integrated circuit die 140 is positioned over and attached to the second surface (e.g., the backside) of the semiconductor wafer 102 and in contact with the adhesive material 128. If the adhesive material 128 is patterned, the selective patterning may allow the adhesive material 128 to reflow laterally during the bonding procedure. Once the bonding procedure is complete (e.g., after curing of the adhesive material 128, etc.), a via 130 is formed that extends through the semiconductor wafer 102 and the adhesive material 128 to a conductive layer 116 in the integrated circuit die 140. The conductive layer 116 of the integrated circuit die 140 is configured to provide an electrical interconnection with one or more integrated circuits formed in the semiconductor wafer 102. The via 130 includes a conductive material 132 that further provides an interconnection between the conductive layer 116 of the semiconductor wafer 102 to a conductive layer 116 of the integrated circuit die 140 so that the integrated circuit of the semiconductor wafer 102 is electrically connected to an integrated circuit formed in the integrated circuit die 140. Once the fabrication is complete, suitable wafer-level packaging processes may be employed to segment and package the individual semiconductor semiconductor device 100. In one or more implementations, the segmented semiconductor devices may comprise wafer chip-scale package devices, which may further be attached to another device (e.g., a printed circuit board) to create an electronic device.

Example Fabrication Processes

Figure 2:
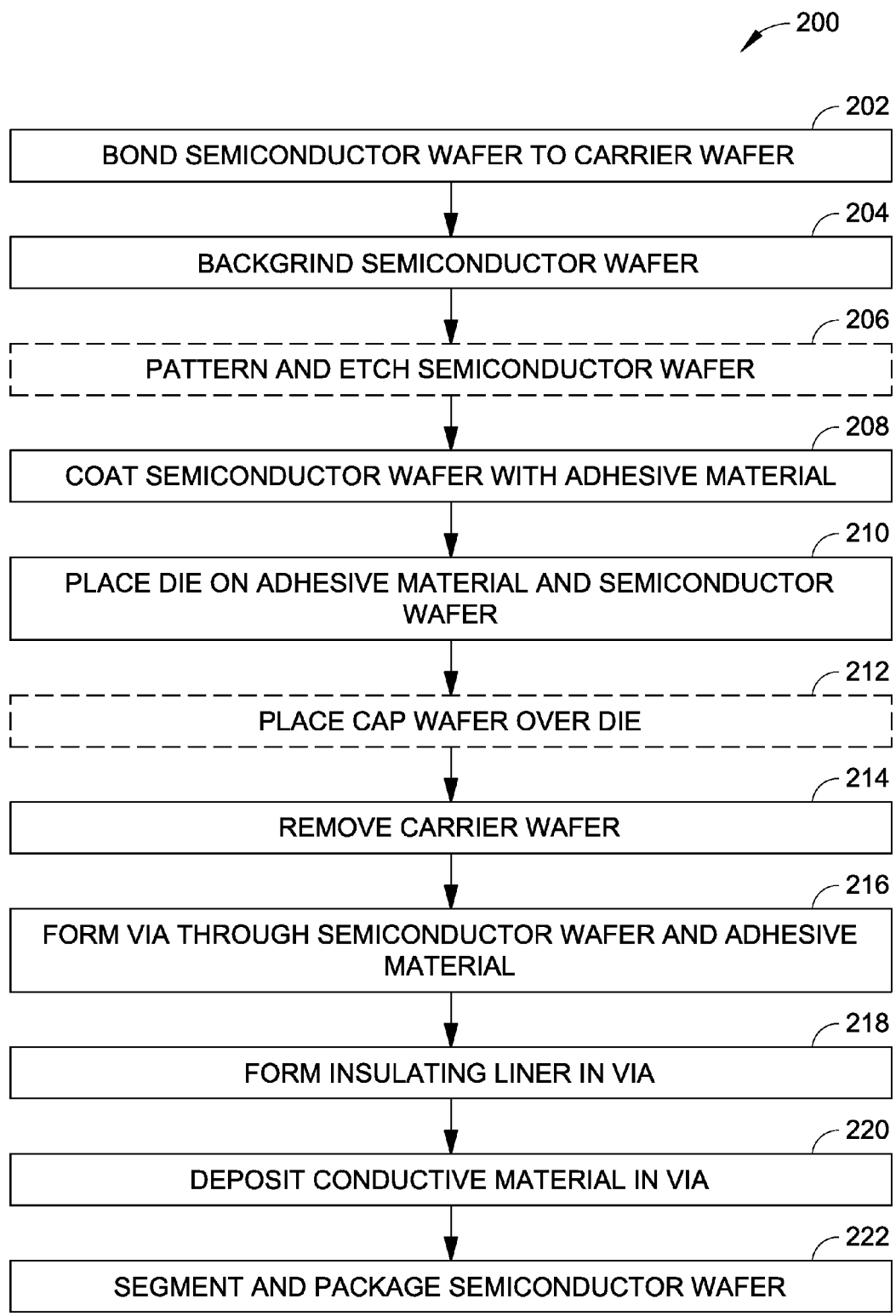
FIG. 2 is a flow diagram illustrating a process in an example implementation for fabricating semiconductor devices, such as the device shown in FIG. 1.
Figure 3A:
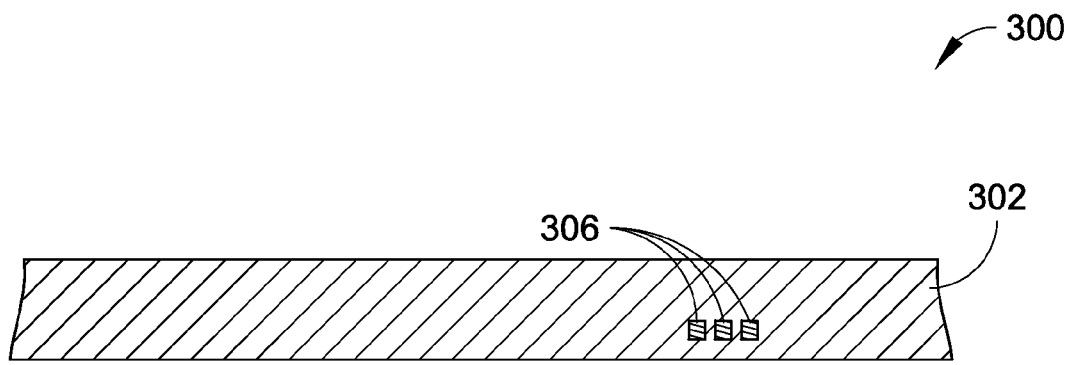
FIGS. 3A through 3G are diagrammatic partial cross-sectional views illustrating the fabrication of wafer-level packaged semiconductor devices, such as the semiconductor device shown in FIGS. 1A and 1B according to the process shown in FIG. 2, in an example implementation.

FIG. 2 illustrates an example process 200 that employs wafer-level packaging techniques to fabricate three-dimensional semiconductor devices, such as the semiconductor device 100 shown in FIGS. 1A and 1B. FIGS. 3A through 3G illustrate sections of example wafers that may be utilized to fabricate semiconductor devices 300 (such as semiconductor device 100) shown in FIGS. 1A and 1B. A semiconductor wafer 302, as shown in FIG. 3A, includes a first surface (e.g., the top or frontside) and a second surface (e.g., the bottom or backside). The semiconductor wafer 302 includes one or more integrated circuits (not shown) formed proximate to the first surface. The integrated circuits are connected to one or more contact pads 316 (e.g., a metal pad, etc.) that are configured to provide electrical contacts through which the integrated circuits are interconnected to other components (e.g., other integrated circuits, printed circuit boards, etc.) associated with semiconductor device 300. The semiconductor wafer 302 may further include one or more interconnect layer(s) 332, 316 formed of various conducting and insulating materials, such as silicon dioxide (SiO$_2$), aluminum, copper, tungsten, and so forth between the contact pads 316 and the first surface of the semiconductor wafer 102. The passivation layer 336 covers the interconnect layer(s) 332, 316 and other components of the semiconductor wafer 302 to provide protection and insulation to the integrated circuits. The passivation layer 336 can be either planarized or non-planar and may include patterned holes to provide access to the contact pads 316.

Figure 3B:
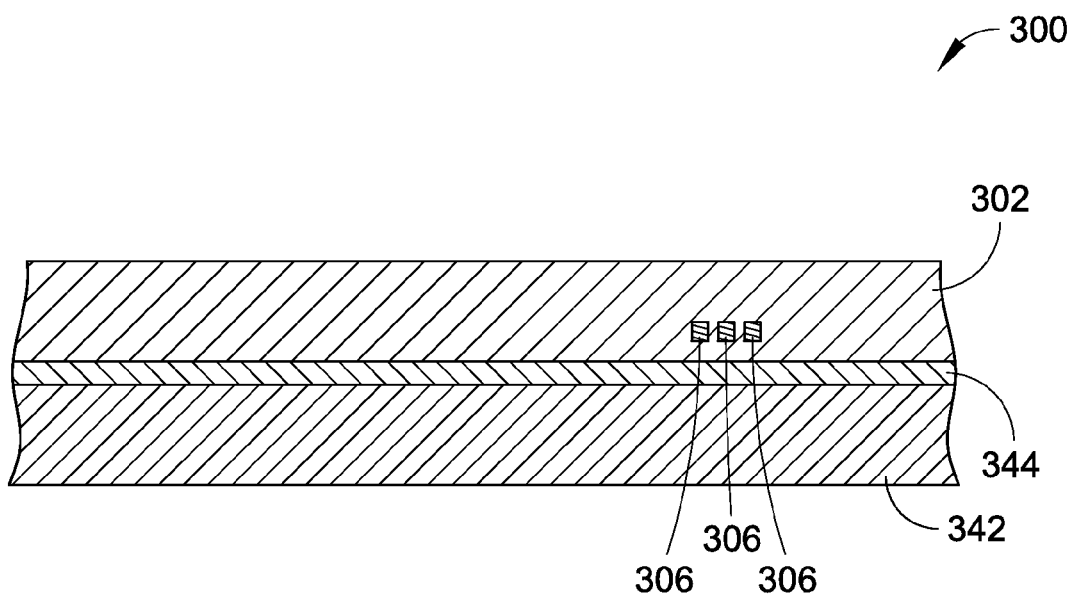

As illustrated in FIG. 2, a semiconductor wafer is bonded to a carrier wafer (Block 202). For example, as shown in FIG. 3B, the semiconductor wafer 302 is bonded to a carrier wafer 342 via a temporary adhesive material 344. In one or more implementations, the temporary adhesive material 344 may be a soluble bonding agent or wax. The carrier wafer 342 is configured to provide structural support to the semiconductor wafer 302 during one or more backgrinding processes. Once the carrier wafer 342 is bonded to the semiconductor wafer 302, a backgrinding process is applied to the second surface (e.g., backside) of the semiconductor wafer 302 to allow for stacking and high density packaging of the semiconductor device (Block 204).

As illustrated in FIG. 3, the semiconductor device 300 includes a semiconductor wafer 302 having a first surface and a second surface. The first surface includes one or more integrated circuits formed therein. The integrated circuits are connected to one or more contact pads 316 to provide electrical interconnection between the integrated circuits and other components associated with the semiconductor device 300 (e.g., other integrated circuits, printed circuit boards, etc.) A passivation layer (e.g., SiO$_2$) at least partially covers the first surface to provide protection to the integrated circuits from later fabrication steps.

Figure 3C:
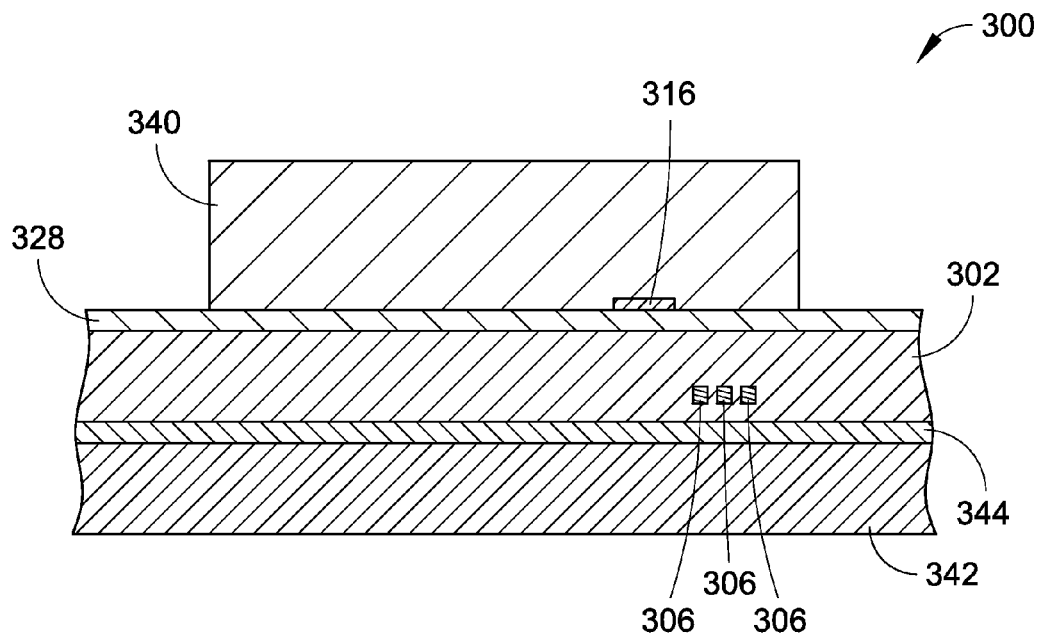
Figure 3D:
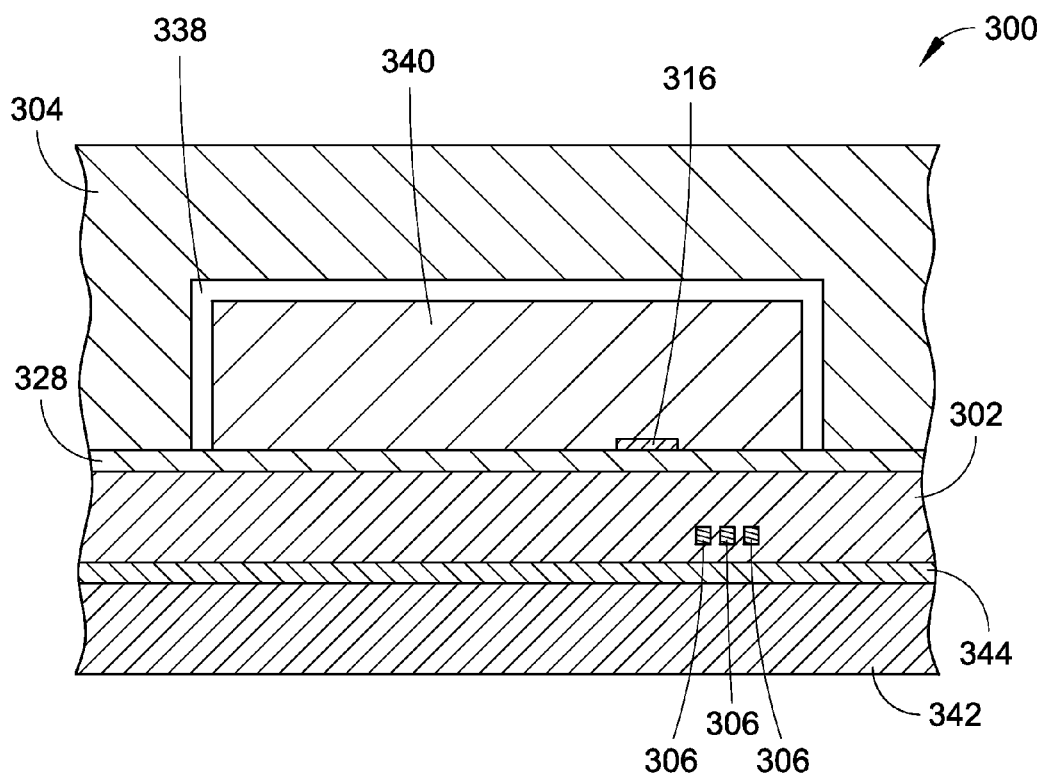

In some embodiments, the second side (e.g., backside) of the semiconductor wafer is patterned and etched (Block 206). In these embodiments and as shown in FIG. 3G, the second side of the semiconductor wafer 302 is patterned (e.g., using photolithography) and wet-etched to form a cavity 338 that is suitable to house the integrated circuit die 340. Wet-etching may include exposing the semiconductor wafer 302 in an etchant (e.g., potassium hydroxide (KOH), buffered hydrofluoric acid, etc.) to remove an exposed portion of the backside of the semiconductor wafer 302. In some embodiments, the first side of the semiconductor wafer 302 may be cushioned and protected with a gas while the second side of the semiconductor wafer 302 is etched to form the cavity 338.

As illustrated in FIG. 2, a second surface of a semiconductor wafer is coated with an adhesive material (Block 208). In implementations where the semiconductor wafer 302 is patterned and etched to form a cavity 338, the second side of the semiconductor wafer 302 as well as the cavity 338 is coated with the adhesive material 328. The adhesive material 328 may be configured as an adhesive dielectric (e.g., benzocyclobutene (BCB), etc.). Once the adhesive material 328 is applied to the semiconductor wafer 302, the adhesive material 328 may be patterned to allow for lateral expansion of the patterned adhesive material 328 when the integrated circuit die 340 is pressed into contact with the patterned adhesive material 328.

Next, the integrated circuit die is placed on the adhesive material and the semiconductor wafer (Block 210). As illustrated in FIG. 3C, placing the integrated circuit die 340 includes placing the integrated circuit die 340 on the adhesive material 328 on the second side of the semiconductor wafer 302. If the semiconductor wafer 302 has been etched, the integrated circuit die 340 is placed in the cavity 338 formed by the etching process. It is contemplated that once the integrated circuit die 340 is attached to the second side of the semiconductor wafer 302, a curing process may be utilized to further harden the adhesive material 328.

In embodiments where the semiconductor wafer is not etched to form a cavity, a cap wafer is placed on the backside of the semiconductor wafer and over the integrated circuit die (Block 212). As shown in FIG. 3D, placing a cap wafer 304 includes placing the cap wafer 304 having a pre-formed cavity 338 on the second side (the second side of the semiconductor wafer 302 is illustrated at the top of FIG. 3D) of the semiconductor wafer 302, where the previously attached integrated circuit die 340 is housed in the pre-formed cavity 338. In implementations, the cap wafer 304 is attached to the adhesive material 328, which may subsequently be cured. In some embodiments, placing the cap wafer 304 may include grinding the cap wafer 304 such that a portion of the integrated circuit chip 340 is exposed. In these specific embodiments, the cavity 338 between the cap wafer 304 and the integrated circuit die 340 may be filled with a mold material or an encapsulation material for further support and/or environmental protection.

It is contemplated that various aligning procedures may be employed to align the integrated circuit die 340, the semiconductor wafer 302, the carrier wafer 342, and/or the cap wafer 304. In an implementation, alignment marking techniques may be utilized to align each component. For instance, the semiconductor wafer 302 may include one or more alignment marks 306 to properly align the semiconductor wafer 302 with the integrated circuit die 340, the carrier wafer 342, and/or the cap wafer 304 during placement and/or bonding. In implementations, visible light/infrared light alignment techniques may be utilized to align each component. In an implementation, a top visible light source (not shown) positioned above the semiconductor wafer 302 provides visible light to properly align the semiconductor wafer 302. Then, a top infrared light detector (not shown) positioned above the semiconductor wafer 302, in combination with a bottom infrared source positioned below the semiconductor wafer 302, allow for positioning of the integrated circuit die 340, the carrier wafer 342, and/or the cap wafer 304. The infrared optics may be configured to provide an infrared light such that an operator, with proper magnification and visualization equipment, can see through the wafers and/or components to allow for proper alignment with the already properly aligned semiconductor wafer 302.

Figure 3E:
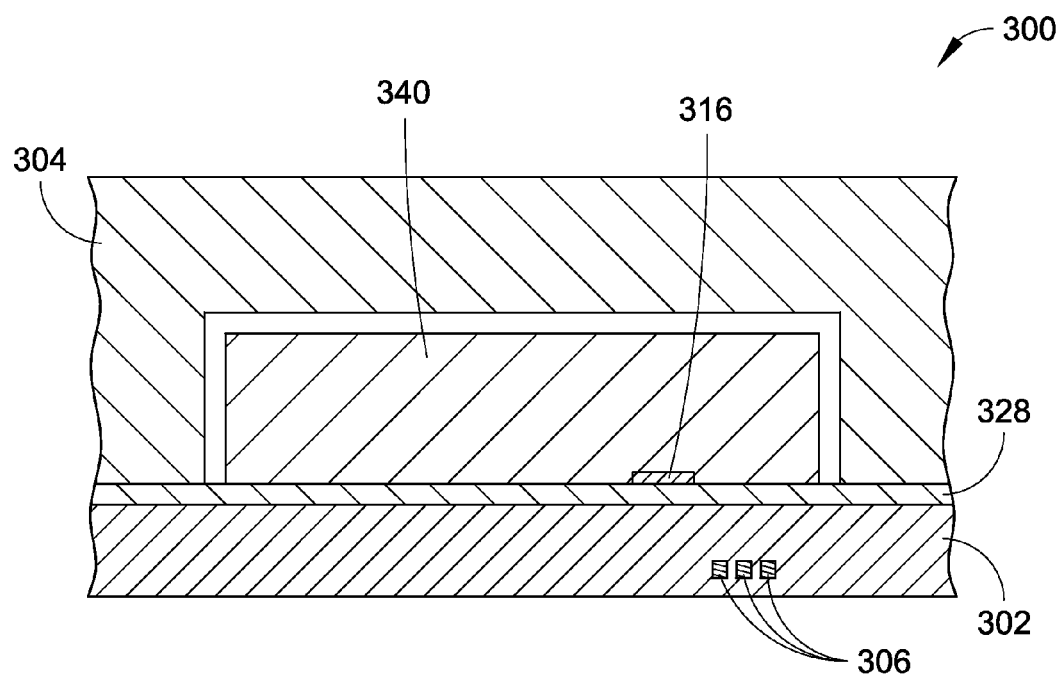
Figure 3F:
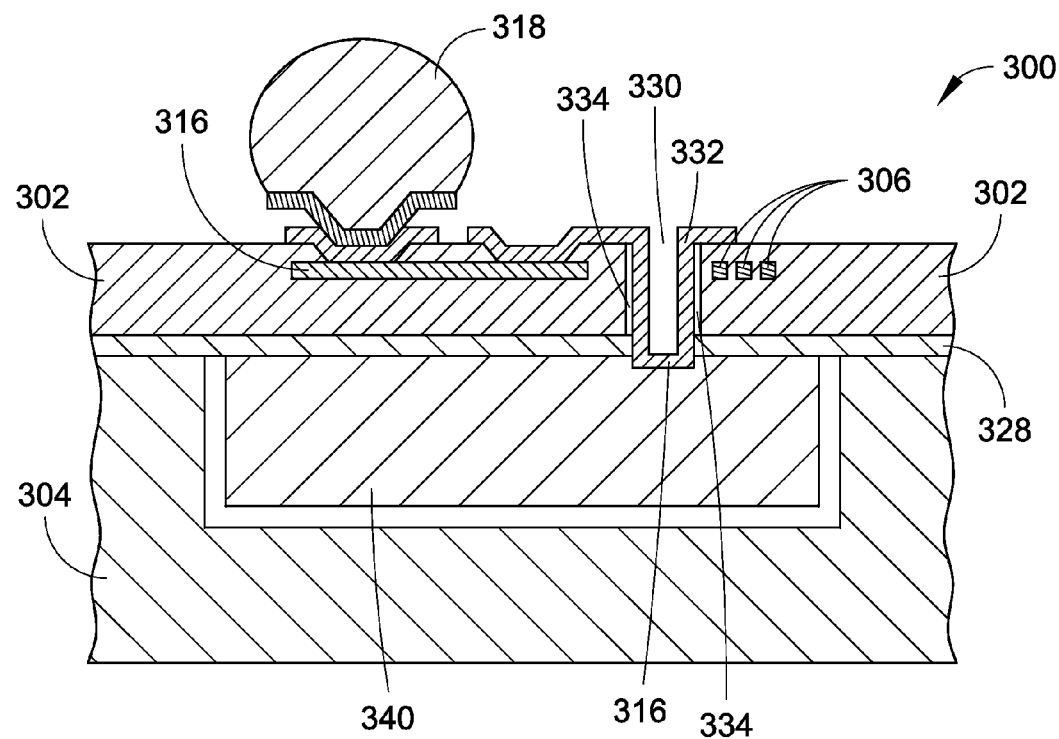
Figure 3G:
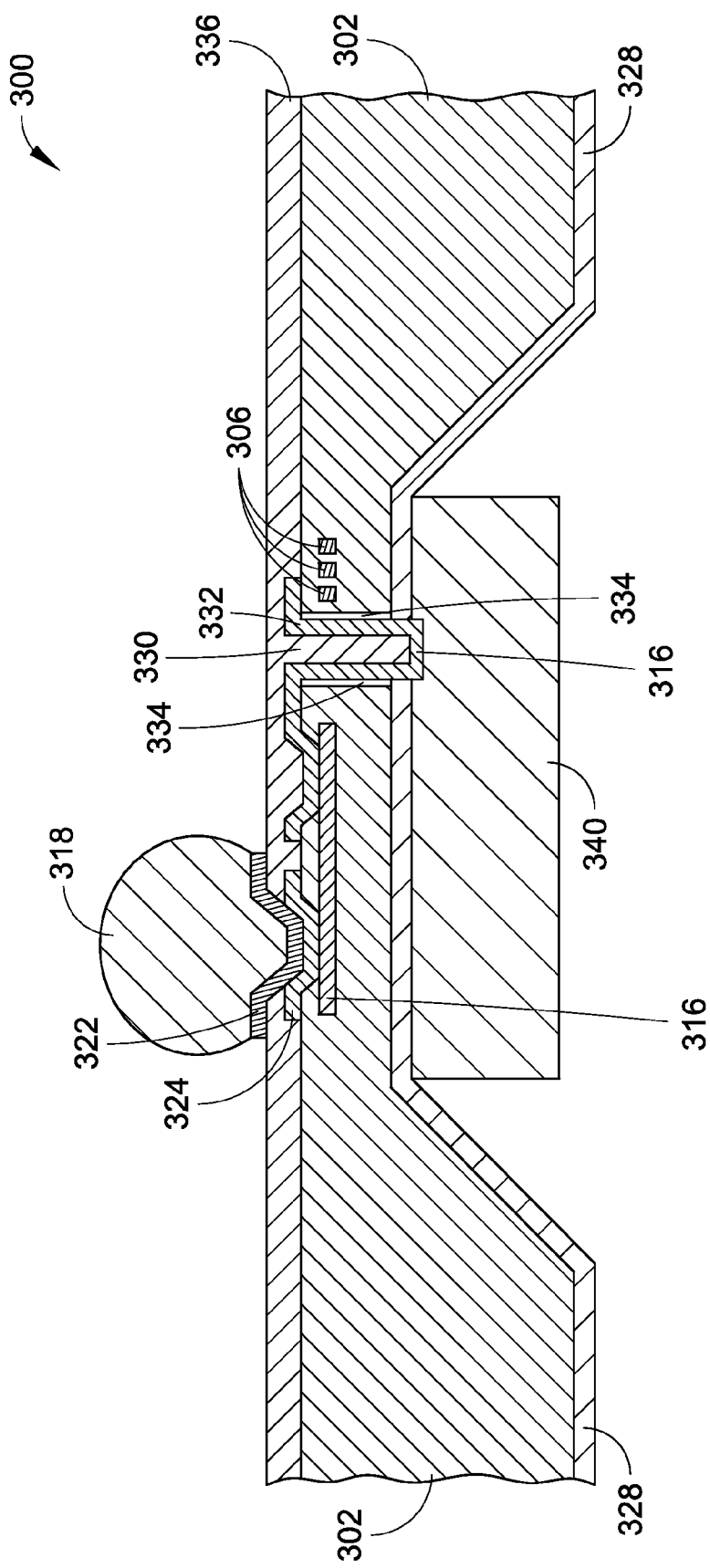

The carrier wafer is then removed from the semiconductor wafer (Block 214) by heating the temporary adhesive material (e.g., temporary adhesive material 344) sufficiently to allow for removal of the carrier wafer (e.g., carrier wafer 342) (see FIG. 3E). A via is then formed through the semiconductor wafer and the adhesive material (Block 216) down (the second side of the semiconductor wafer is illustrated at the bottom in FIG. 3E) to a conductive layer disposed as a portion of the integrated circuit die. The via 330 is formed by etching an aperture through the semiconductor wafer 302 and the adhesive material 328. As illustrated in FIGS. 3F and 3G, a via 330 is formed through the semiconductor wafer 302 and the adhesive material 328 utilizing one or more photolithography and etching techniques. For instance, once the semiconductor wafer 302 is patterned, an etch to remove the various insulation layers (e.g., passivation layers), silicon layers, adhesive material, and so forth, is performed. The etching step is configured to form the via 330 and to stop on the conductive pad (e.g., conductive pad 316 of the integrated circuit die 340). It is contemplated that various etching techniques (e.g., dry etch, wet etch, etc.) may be utilized depending on the requirements of the semiconductor device 300, the via 330, and so forth.

An insulating liner is formed in the via (Block 218) to electrically isolate the semiconductor wafer from the via. In an implementation, an insulating material is first deposited via plasma enhanced chemical vapor deposition (PECVD) techniques and then anisotropically etched down to the conductive layer 316 to form the insulating liner 334 as shown in FIGS. 3F and 3G. Moreover, a diffusion barrier metal (e.g., Ti, etc.) and a seed metal may be deposited over the first surface of the semiconductor wafer 302 as a part of the electrical interconnection layers (e.g., redistribution layer 124, conductive material 332, conductive pad 316, etc.). The barrier metal and the seed metal may be patterned (e.g., via photolithography) to further provide electrical interconnections between the semiconductor wafer 302 and the integrated circuit die 340 at later fabrication stages.

A conductive material is then deposited in the via (Block 220) to provide an electrical interconnection between the semiconductor wafer and the integrated circuit die. For instance, as illustrated in FIGS. 3F and 3G, a conductive material 332 (e.g., copper, or the like) is deposited in the via 330 to form an electrical interconnection between the conductive layer 316 of the semiconductor wafer 302 and the conductive layer 316 of the integrated circuit die 340. In one or more implementations, the conductive material 332 is selectively plated-up via electroplating to form the electrical interconnections. Moreover, in one or more implementations, the conductive material 332 deposited in the via 330 may also serve as the conductive material utilized for a redistribution structure, such as the redistribution structure 324 shown in FIGS. 3F and 3G. Thus, the deposition of the conductive material 332 in the via 330 may also result in the formation of a redistribution structure. It is contemplated that further semiconductor fabrication techniques may be utilized to finalize the semiconductor device 300 fabrication process. For instance, further stripping of photoresist, etching of the seed and barrier metals to electrically isolate plated-up lines, and depositing of passivation layers may be incorporated. For example, seed and barrier metal in unplated areas may be removed to form the electrical interconnections.

Once the wafer fabrication process is complete, suitable wafer-level packaging processes may be employed to segment and package the individual semiconductor devices (Block 222). In one or more implementations, the segmented semiconductor devices may comprise wafer chip-scale package devices.

CONCLUSION

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims.

What is claimed is:

1. A semiconductor device comprising:
  a processed semiconductor wafer having a first surface and a second surface, where the processed semiconductor wafer includes integrated circuits formed proximate to the first surface of the processed semiconductor wafer and includes a first conductive layer disposed over the first surface of the processed semiconductor wafer;
  an integrated circuit die coupled to the second surface of the processed semiconductor wafer with an adhesive material, where the integrated circuit die includes a conductive pad disposed proximate to the second surface of the processed semiconductor wafer; and
  a via formed from the first conductive layer to the conductive pad and through the first surface of the processed semiconductor wafer to the second surface of the processed semiconductor wafer, where the via includes a conductive material configured to electrically couple the conductive pad of the integrated circuit die to the first conductive layer and the first side of the processed semiconductor wafer.

2. The semiconductor device as recited in claim 1, wherein the processed semiconductor wafer comprises a processed semiconductor wafer with an etched cavity disposed on the second surface, where the cavity is configured to house the integrated circuit die.

3. The semiconductor device as recited in claim 1, further comprising:

a cap wafer attached to the second surface of the processed semiconductor wafer and over the integrated circuit die, where the cap wafer includes a cavity configured to house the integrated circuit die.

4. The semiconductor device as recited in claim 1, wherein the adhesive material comprises benzocyclobutene (BCB).

5. The semiconductor device as recited in claim 1, wherein the via further includes an insulating liner configured to electrically isolate the processed semiconductor wafer and the adhesive material from the conductive material disposed in the via.

6. The semiconductor device as recited in claim 5, wherein the insulating liner extends at least substantially through the thickness of the processed semiconductor wafer and at least substantially through the thickness of the adhesive material.

7. The semiconductor device as recited in claim 6, wherein the insulating liner comprises silicon dioxide.

8. The semiconductor device as recited in claim 5, wherein the conductive material comprises a seed layer of copper formed over the insulating liner.

9. The semiconductor device as recited in claim 1, wherein the conductive material comprises copper.

10. The semiconductor device as recited in claim 1, wherein the conductive material extends from the via to form a redistribution structure proximate to the first surface of the processed semiconductor wafer.

11. The semiconductor device as recited in claim 1, further comprising a solder bump assembly electrically coupled to the conductive layer.

12. An electronic device comprising:
a printed circuit board; and
a semiconductor device coupled to the printed circuit board, the semiconductor device including
  a segmented portion of a processed semiconductor wafer having a first surface and a second surface, where the segmented portion of the processed semiconductor wafer includes integrated circuits formed proximate to the first surface of the segmented portion of the processed semiconductor wafer and includes a first conductive layer disposed over the first surface of the segmented portion of the processed semiconductor wafer;
  an integrated circuit die coupled to the second surface of the segmented portion of the processed semiconductor wafer with an adhesive material, where the integrated circuit die includes a conductive pad disposed proximate to the second surface of the segmented portion of the processed semiconductor wafer; and
  a via formed from the first conductive layer to the conductive pad and through the first surface of the segmented portion of the processed semiconductor wafer to the second surface of the segmented portion of the processed semiconductor wafer, where the via includes a conductive material configured to electrically couple the conductive pad of the integrated circuit die to the first conductive layer and the first side of the segmented portion of the processed semiconductor wafer.

\* \* \* \* \*